(12) United States Patent
Novack et al.

(10) Patent No.: US 9,871,153 B2
(45) Date of Patent: Jan. 16, 2018

(54) PHOTODETECTOR WITH INTEGRATED TEMPERATURE CONTROL ELEMENT FORMED AT LEAST IN PART IN A SEMICONDUCTOR LAYER

(71) Applicant: Coriant Advanced Technology, LLC, New York, NY (US)

(72) Inventors: Ari Novack, New York, NY (US); Ruizhi Shi, New York, NY (US); Jean Claude Labarrie, New York, NY (US)

(73) Assignee: Elenion Technologies, Inc., New York, NY (US)

(*) Notice: Subject to any disclaimer, the term of this patent is extended or adjusted under 35 U.S.C. 154(b) by 176 days.

(21) Appl. No.: 14/864,760

(22) Filed: Sep. 24, 2015

(65) Prior Publication Data
US 2017/0092785 A1   Mar. 30, 2017

(51) Int. Cl.
| | | |
|---|---|---|
| *H01L 31/024* | (2014.01) | |
| *H01L 31/028* | (2006.01) | |
| *H01L 31/18* | (2006.01) | |
| *H01L 31/20* | (2006.01) | |
| *H01L 27/14* | (2006.01) | |
| *H01L 27/16* | (2006.01) | |
| *H01L 23/34* | (2006.01) | |

(52) U.S. Cl.
CPC ............ *H01L 31/024* (2013.01); *H01L 27/14* (2013.01); *H01L 27/16* (2013.01); *H01L 31/028* (2013.01); *H01L 31/1808* (2013.01); *H01L 31/204* (2013.01); *H01L 23/345* (2013.01)

(58) Field of Classification Search
CPC ....... H01L 23/345; H01L 23/38; H01L 27/16; H01L 21/6724; G02B 2006/1213; G02B 6/29398; H05B 1/0233

USPC ................... 250/238, 214 R, 214.1
See application file for complete search history.

(56) References Cited

U.S. PATENT DOCUMENTS

| | | | |
|---|---|---|---|
| 5,130,920 A | 7/1992 | Gebo | |
| 5,508,740 A * | 4/1996 | Miyaguchi | ............. H01L 23/34 |
| | | | 257/E23.08 |
| 7,200,308 B2 | 4/2007 | Hochberg | |

(Continued)

FOREIGN PATENT DOCUMENTS

WO    WO 2008/103678      8/2008

OTHER PUBLICATIONS

International Search Report, PCT/US2016/053409, dated Jan. 3, 2017 (4 pages).

(Continued)

*Primary Examiner* — Que T Le
(74) *Attorney, Agent, or Firm* — Nixon Peabody LLP (57) ABSTRACT

A temperature-controlled photodetector sub-system is described. The temperature control element allows the operation of the photodetector at a desired temperature. The temperature control element can be a heater or a cooler. In some cases, the photodetector is a germanium photodetector. In some cases a temperature measuring device is provided. In some cases, a control circuit is used to control the temperature of the germanium photodetector within a temperature range, or at a temperature of interest. An advantage provided by the apparatus described is the operation of the photodetector so that the responsivity of the germanium detector can be held at essentially a constant value.

18 Claims, 8 Drawing Sheets

(56) References Cited

U.S. PATENT DOCUMENTS

| | | |
|---|---|---|
| 7,339,724 B2 | 3/2008 | Hochberg |
| 7,424,192 B2 | 9/2008 | Hochberg |
| 7,480,434 B2 | 1/2009 | Hochberg |
| 7,566,865 B2 * | 7/2009 | Harder ............... H01L 31/024 250/238 |
| 7,643,714 B2 | 1/2010 | Hochberg |
| 7,760,970 B2 | 7/2010 | Baehr-Jones |
| 7,894,696 B2 | 2/2011 | Baehr-Jones |
| 8,031,985 B2 | 10/2011 | Hochberg |
| 8,067,724 B2 | 11/2011 | Hochberg |
| 8,098,965 B1 | 1/2012 | Baehr-Jones |
| 8,203,115 B2 | 6/2012 | Hochberg |
| 8,237,102 B1 | 8/2012 | Baehr-Jones |
| 8,258,476 B1 | 9/2012 | Baehr-Jones |
| 8,270,778 B2 | 9/2012 | Hochberg |
| 8,274,021 B2 | 9/2012 | Wang |
| 8,280,211 B1 | 10/2012 | Baehr-Jones |
| 8,311,374 B2 | 11/2012 | Hochberg |
| 8,340,486 B1 | 12/2012 | Hochberg |
| 8,380,016 B1 | 2/2013 | Hochberg |
| 8,390,922 B1 | 3/2013 | Baehr-Jones |
| 8,798,406 B1 | 8/2014 | Hochberg |
| 8,818,141 B1 | 8/2014 | Hochberg |
| 2006/0051010 A1 | 3/2006 | Chu |
| 2015/0243800 A1 | 8/2015 | Shi |

OTHER PUBLICATIONS

Written Opinion of the International Searching Authority, PCT/US2016/053409, dated Jan. 3, 2017 (6 pages).

\* cited by examiner

PHOTODETECTOR WITH INTEGRATED TEMPERATURE CONTROL ELEMENT FORMED AT LEAST IN PART IN A SEMICONDUCTOR LAYER

FIELD OF THE INVENTION

The invention relates to photodetectors in general and particularly to germanium photodetectors.

BACKGROUND OF THE INVENTION

Bulk germanium has a direct band gap energy of roughly 0.8 eV, which is equivalent to about 1550 nm. Tensile strain lowers the band energy so that most wavelengths in the C-band can be absorbed at room temperature (roughly 20° C.). However, at lower temperatures, there is a shift of the band gap to high energies. Photons with low energy and long wavelength then are not able to be absorbed efficiently. This is an issue in products that can see a large temperature range during deployment. In particular, for products and devices that use germanium photodetectors, the responsivity would have to be specified to the worst case temperature. For some temperatures that are low enough, the product or device might not operate acceptably.

Also known in the prior art is Gebo, U.S. Pat. No. 5,130,920, issued Jul. 14, 1992, which is said to disclose a control system (method and apparatus) is adaptive on-line with changing process conditions, for example, the specific heat of a liquid used in a process. The system regulates a variable of a process (temperature of the liquid used in the process) and has a fast dynamic response to handle temperature transients while adapting to changing process conditions. The system uses feedforward and feedback control loops, which in the case of the process involving the temperature control of a liquid are respectively responsive to the temperature of the liquid before and after a control point. The system exercises adaptive control of the feedforward control function from the feedback loop. The system is preferably implemented with a digital computer. The fast dynamic response is enhanced by applying microwave energy from a microwave generator to heat the liquid at the control point with the feedforward and feedback control loops controlling the microwave generator.

Also known in the prior art is Wang et al., U.S. Pat. No. 8,274,021, issued Sep. 25, 2012, which is said to disclose an integrated temperature regulator that can be fabricated using conventional semiconductor processing technology. The integrated temperature regulator can include a reaction chamber, for example fabricated from PDMS, in which chemical or biochemical reactions of interest can be carried out. The temperature regular can also be used to regulate the temperature of some circuits, e.g. an effective-inductance-change based magnetic particle sensor, to achieve a stable operation performance, such as an improved sensitivity. The integrated temperature regulator includes as subcomponents a temperature sensing circuit that receives a thermal signal from the vicinity of the reaction chamber, a temperature reference circuit, and a temperature control circuit that controls a heater based at least in part on the difference between the sensed temperature and the reference temperature. The various subcomponents can be programmable.

There is a need for improvements in products and devices that employ germanium photodetectors and that may be operated under varying temperature conditions.

SUMMARY OF THE INVENTION

According to one aspect, the invention features a temperature-controlled photodetector sub-system, comprising: a photodetector on a substrate, the photodetector having at least one first edge; and a temperature control element on the substrate and having a second edge situated proximate the at least one first edge of the photodetector.

In one embodiment, the photodetector is a germanium photodetector.

In another embodiment, the temperature control element is a selected one of a heater and a cooler.

In yet another embodiment, the second edge of the temperature control element is situated within a distance of less than 10 microns from the at least one first edge of the photodetector.

In a further embodiment, the temperature control element has the second edge situated within a distance of less than 50 microns from the at least one first edge of the photodetector.

In still another embodiment, the temperature control element is a Peltier device.

In a further embodiment, the temperature-controlled photodetector sub-system further comprises a thermal measurement device situated proximate to the photodetector.

In yet a further embodiment, the temperature-controlled photodetector sub-system is in combination with a control circuit.

In an additional embodiment, the temperature-controlled photodetector sub-system in combination with the control circuit is configured in a control loop selected from the group consisting of a feedforward control loop and a feedback control loop.

In one more embodiment, the temperature control element comprises a selected one of a plurality of heaters and a plurality of coolers.

In still a further embodiment, two of the selected one of the plurality of heaters and the plurality of coolers are situated on opposite sides of the photodetector.

In one embodiment, the temperature control element is a resistive heater.

In another embodiment, the temperature-controlled photodetector sub-system further comprises a signal barrier between the photodetector and the temperature control element.

In yet another embodiment, the signal barrier is a p-n-p-n junction.

According to another aspect, the invention relates to a method of operating a temperature-controlled photodetector sub-system, comprising the steps of: providing the photodetector on a substrate, the photodetector having at least one first edge, and the temperature control element on the substrate having a second edge situated proximate to the at least one first edge of the photodetector; operating the photodetector to detect illumination, and operating the temperature control element to control a temperature of the photodetector within a temperature range between a defined minimum temperature and a defined maximum temperature.

In one embodiment, the photodetector is a germanium photodetector.

In another embodiment, the temperature control element is a selected one of a heater and a cooler.

In still another embodiment, the temperature control element is a Peltier device.

In yet another embodiment, the method further comprises the steps of providing a control circuit in combination with the photodetector, and operating the control circuit.

In still another embodiment, the control circuit in combination with the photodetector are configured in a control loop selected from the group consisting of a feedforward control loop and a feedback control loop.

In a further embodiment, the temperature control element on the substrate comprises a selected one of a plurality of heaters and a plurality of coolers.

In yet a further embodiment, two of the selected one of the plurality of heaters and the plurality of coolers are situated on opposite sides of the photodetector.

In an additional embodiment, the defined minimum temperature is 0° C.

In one more embodiment, the defined maximum temperature is 90° C. According to another aspect, the invention relates to a method of making a temperature-controlled photodetector sub-system, comprising the steps of: fabricating the photodetector on a substrate, the photodetector having at least one edge; and fabricating the temperature control element on the substrate, the temperature control element having a second edge situated proximate to the at least one edge of the photodetector.

In one embodiment, the photodetector is a germanium photodetector.

In another embodiment, the temperature control element is a selected one of a heater and a cooler.

In a further embodiment, the second edge of the temperature control element is less than 10 microns from the at least one edge of the photodetector.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION

Acronyms

A list of acronyms and their usual meanings in the present document (unless otherwise explicitly stated to denote a different thing) are presented below.

APD Avalanche Photodetector
ARM Anti-Reflection Microstructure
BOX Buried Oxide
CMOS Complementary Metal-Oxide-Semiconductor
CMP Chemical-Mechanical Planarization
LIV Light intensity(L)-Current(I)-Voltage(V)
MFD Mode Field Diameter
PIC Photonic Integrated Circuits
Q Quality factor $$Q = 2\pi \times \frac{\text{Energy Stored}}{\text{Energy dissipated per cycle}} = 2\pi f_r \times \frac{\text{Energy Stored}}{\text{Power Loss}}.$$

SOI Silicon on Insulator
TEC Thermal Electric Cooler

In the description that follows, the photodetector is described using a germanium photodetector as one embodiment. However, it should be understood that photodetectors made of other materials can also be provided according to principles of the invention. In some embodiments, a temperature control element is used, which temperature control element can be a heater and/or a cooler. In some embodiments the temperature control element can provide both and cooling, for example if the temperature control element is a Peltier device.

The problem of responsivity that has been identified above is demonstrated as shown in Table I, which illustrates the responsivity of a germanium detector with variations in wavelength and temperature.

TABLE I

| Wavelength (nm) | Temperature | | | | |
|---|---|---|---|---|---|
| | 5° C. | 15° C. | 30° C. | 50° C. | 70° C. |
| 1525 | | 0.72 | 0.79 | 0.78 | 0.75 |
| 1550 | | 0.73 | 0.81 | 0.83 | 0.71 |
| 1570 | 0.43 | 0.43 | 0.67 | 0.83 | 0.98 |

One solution to alleviate the effect of low temperature is to heat the photodetector. However, the small size of the detector and the large temperature shift make the localized heating difficult. Simulation of the heater geometry shows a quick roll-off of the temperature gradient. We demonstrate that in a preferred embodiment the heater needs to be placed within a few tens of microns to the germanium photodetector.

Figure 1:
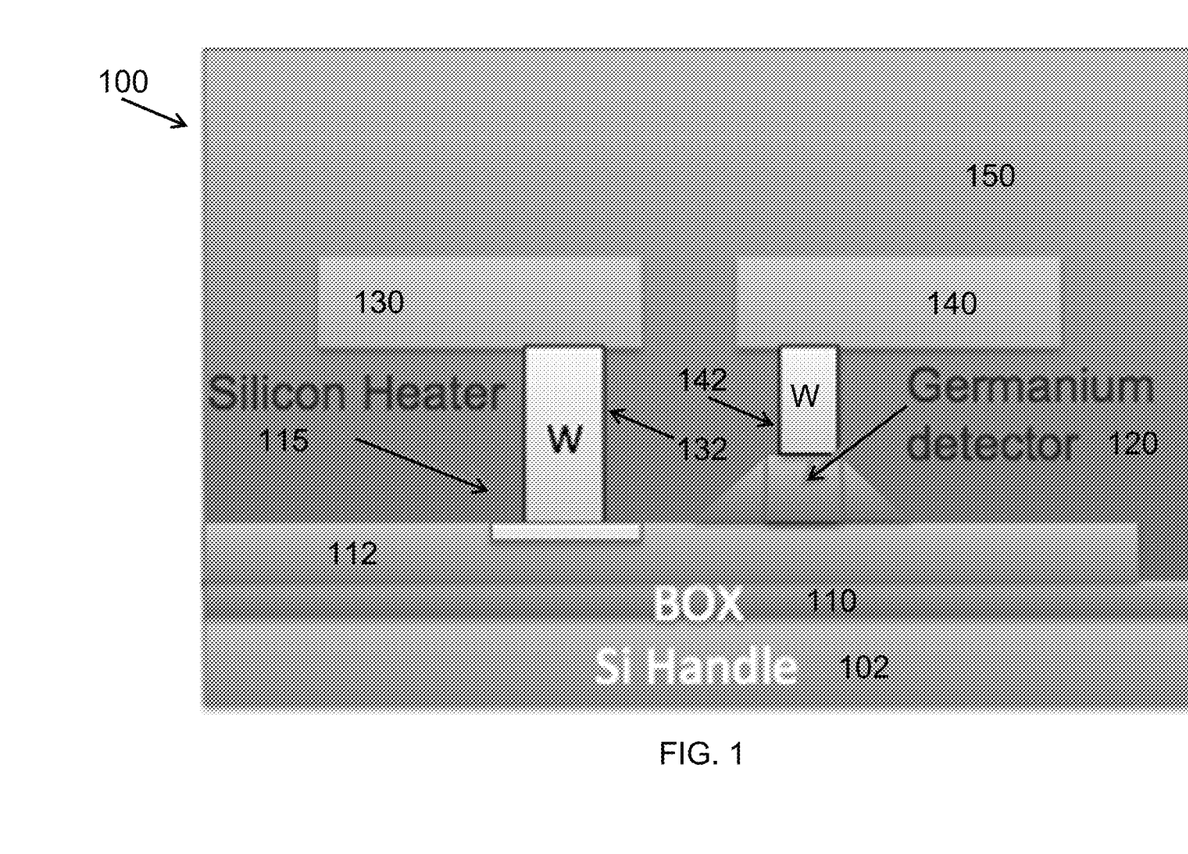
FIG. 1 is a schematic diagram in cross section of a silicon photonic wafer showing the orientation of a germanium detector and a silicon heater.

FIG. 1 is a schematic diagram 100 in cross section of a silicon photonic wafer showing the relative orientation of a germanium photodetector 120 and silicon heater 115. In FIG. 1 there is shown a silicon wafer 102 that serves as a handle, a BOX layer 110, a silicon device layer 112, the silicon heater 115, the germanium photodetector 120, a tungsten (W) contact 132 to the silicon heater 115, a tungsten contact 142 to the germanium photodetector 120, and electrical terminals 130 and 140. The electrical terminals can be constructed from metallization layers that are provided as part of conventional CMOS processing. One can also have terminals in electrical communication with each of the silicon heater 115 and germanium photodetector 120 provided by way of silicon device layer 112. An oxide layer 150 may be deposited over the silicon heater 115 and germanium photodetector 120.

In various embodiments, the heater 115 can be a resistive heater, or an inductive heater. In some embodiments, heat can be generated within the germanium photodetector as a consequence of the absorption of incoming optical radiation. In instances where very precise control of temperature is desired, the effect of this heating by absorption of optical radiation can be taken into account.

Figure 2:
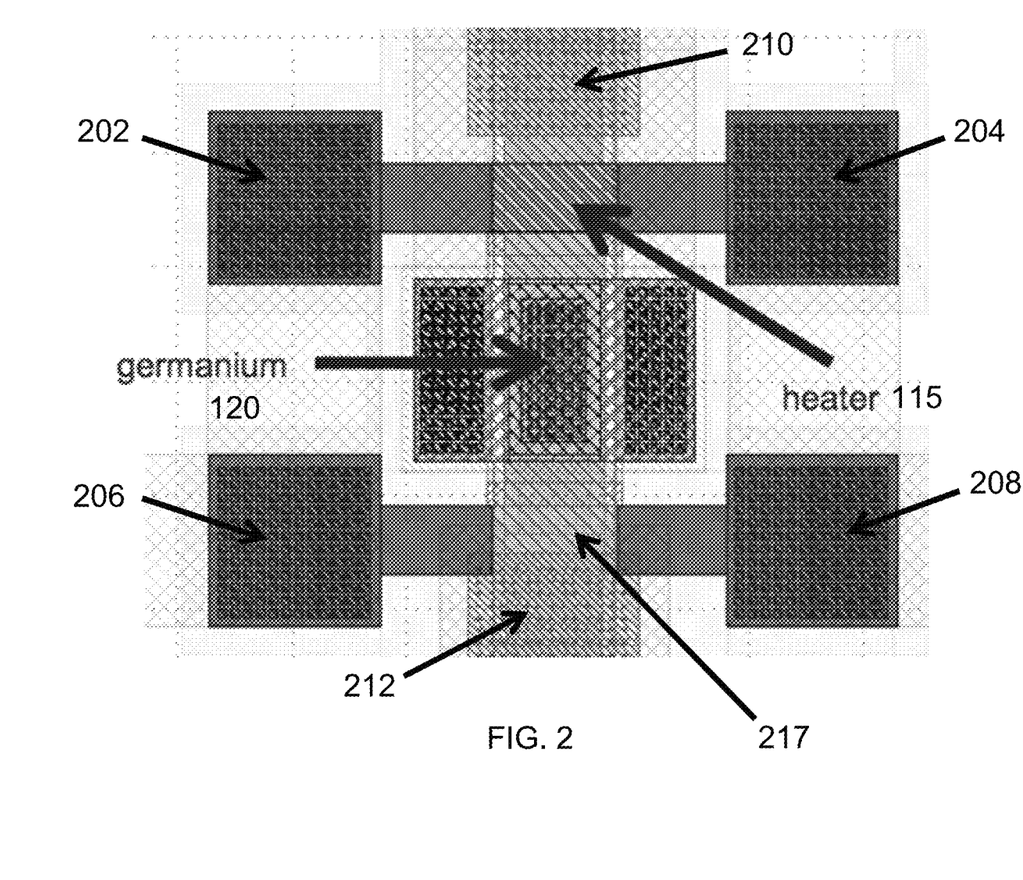
FIG. 2 is a plan view of a silicon photonic wafer that includes a germanium photodetector and one silicon heater.

FIG. 2 is a plan view of a silicon photonic wafer that includes a germanium photodetector 120 and one silicon heater 115. The edge of the heater 115 is just 6 µm from the edge of the germanium photodetector 120. In FIG. 2 there is also shown a location 217 where a second heater can in some embodiments be provided, so as to induce a symmetric thermal field about the germanium photodetector 120. Also shown are contact pads 202, 204, 206, 208 (for the silicon heater electrical connections) and contact pads 210, 212 for the germanium photodetector connections. In various embodiments, the edge of the heater 115 is spaced from the edge of the germanium photo detector by a distance of 1 µm, 2 µm, 3, µm, 4 µm, 5 µm, 7 µm, 8 µm, 9 µm, 10 µm, 12 µm, 15 µm or 20 µm.

One or more heaters can be placed directly adjacent to the germanium of the photodetector by integrating the heater into the silicon that the germanium is grown on. This creates the smallest distance from heater to germanium and thus the maximum efficiency of the heater. In the embodiment illustrated, the heater is less than 20 µm away from the edge of the photodetector.

Figure 3:
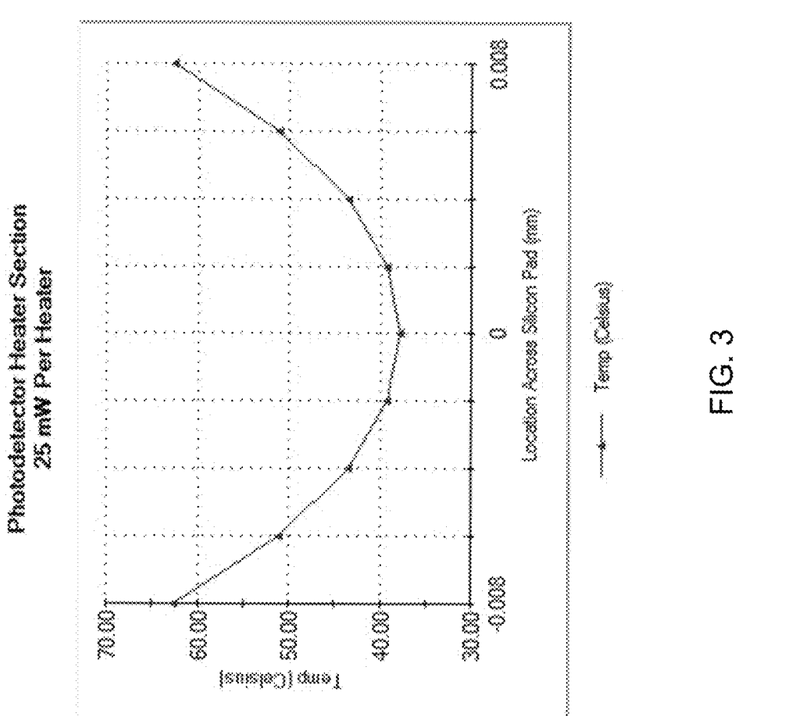
FIG. 3 is a graph showing the simulated temperature along a line passing through the photodetector from one heater to the other.

FIG. 3 is a graph showing the simulated temperature along a line passing through the photodetector from one heater to the other.

Figure 4:
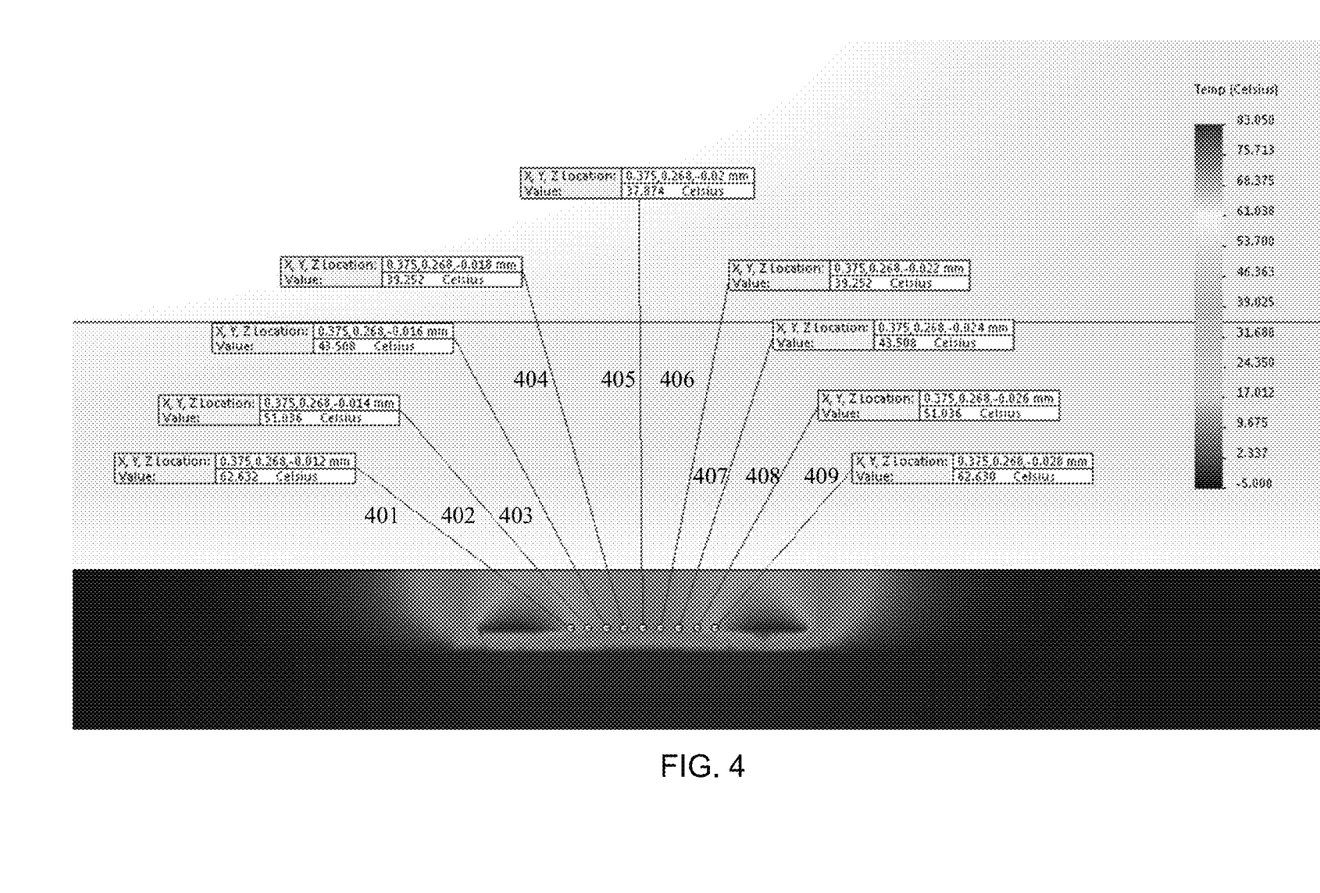
FIG. 4 is a graph showing a cross sectional view through the results of a simulation of the temperature along a line passing through the photodetector from one heater to the other.

FIG. 4 is a graph showing a cross sectional view through the results of a simulation of the temperature along a line passing through the photodetector from one heater to the other. In FIG. 4, locations indicated by the numerals 401, . . . , 409 which are adjacent respective lead lines have the parameters shown in Table II.

TABLE II

| Position | X | Y | Z (mm) | Temp (° C.) |
|---|---|---|---|---|
| 401 | 0.375 | 0.268 | −0.012 | 63.632 |
| 402 | 0.375 | 0.268 | −0.014 | 51.036 |
| 403 | 0.375 | 0.268 | −0.016 | 43.508 |
| 404 | 0.375 | 0.268 | −0.018 | 39.252 |
| 405 | 0.375 | 0.268 | −0.020 | 37.874 |
| 406 | 0.375 | 0.268 | −0.022 | 39.252 |
| 407 | 0.375 | 0.268 | −0.024 | 43.508 |
| 408 | 0.375 | 0.268 | −0.026 | 51.036 |
| 409 | 0.375 | 0.268 | −0.028 | 63.630 |

In FIG. 4, the Z direction is taken along an axis between the two heaters, while the X and Y directions define a plane normal to the Z direction. The steps along the Z direction are each 0.002 mm or 2 microns long.

Figure 5:
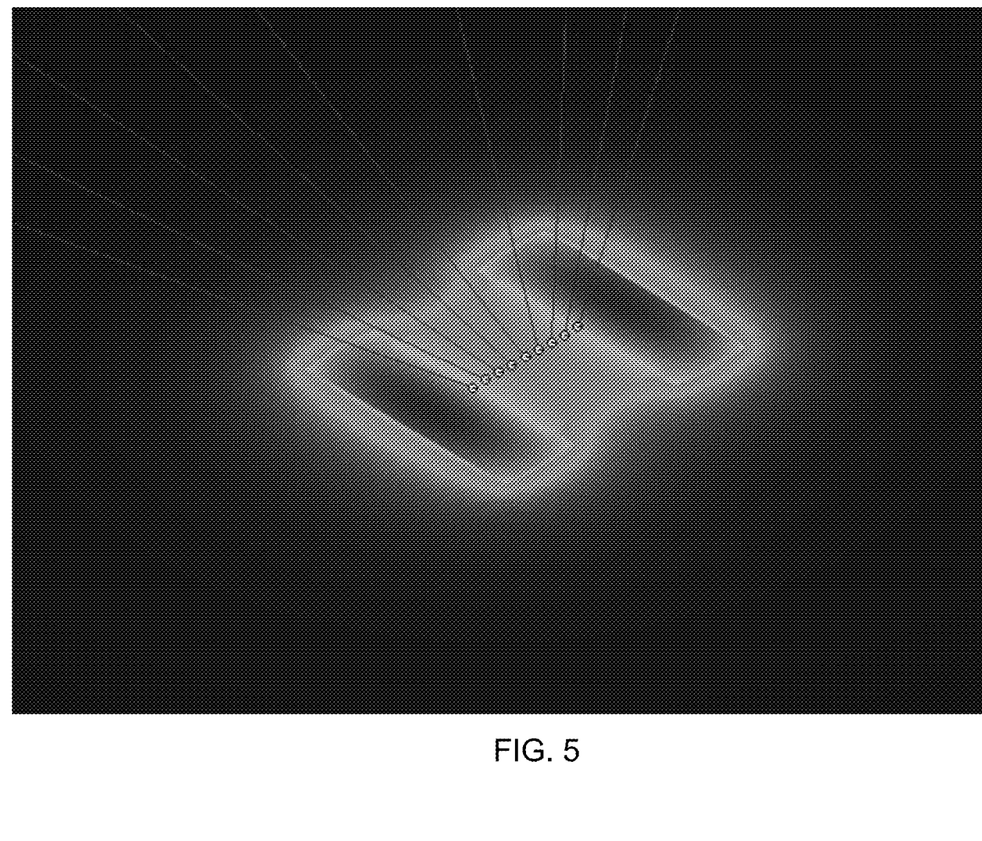
FIG. 5 is a diagram showing a perspective view through the results of a simulation of the temperature along a line passing through the photodetector from one heater to the other.

FIG. 5 is a diagram showing a perspective view through the results of a simulation of the temperature along a line passing through the photodetector from one heater to the other.

Figure 6:
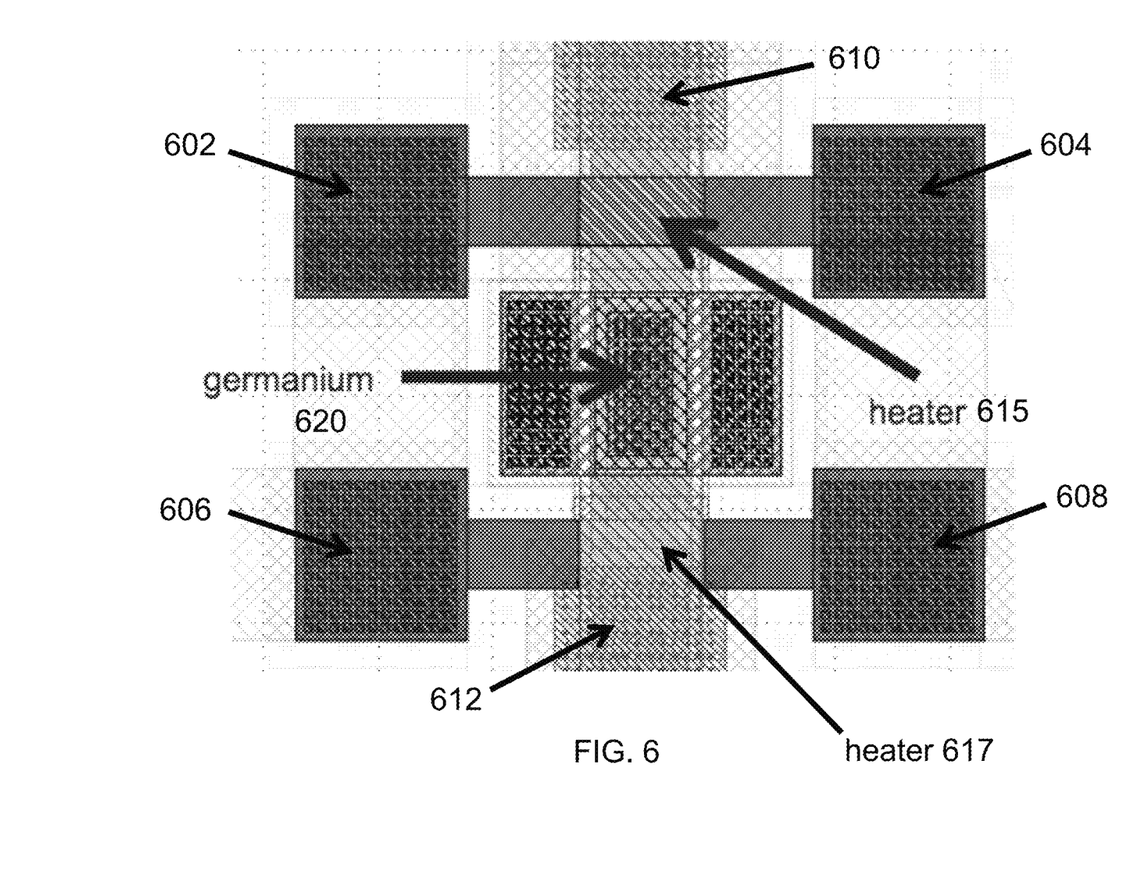
FIG. 6 is a plan view of a silicon photonic wafer that includes a germanium photodetector and two silicon heaters.

FIG. 6 is a plan view of an embodiment of a silicon photonic wafer that includes a germanium photodetector 620 and two silicon heaters 615, 617. In the embodiment illustrated, the edges of the heaters 615, 617 are just 6 µm from the edge of the germanium photodetector 620. In the embodiment illustrated, there are also shown contact pads 602, 604, 606, 608 for the silicon heater electrical connections and contact pads 610, 612 for the germanium photodetector connections.

Figure 7:
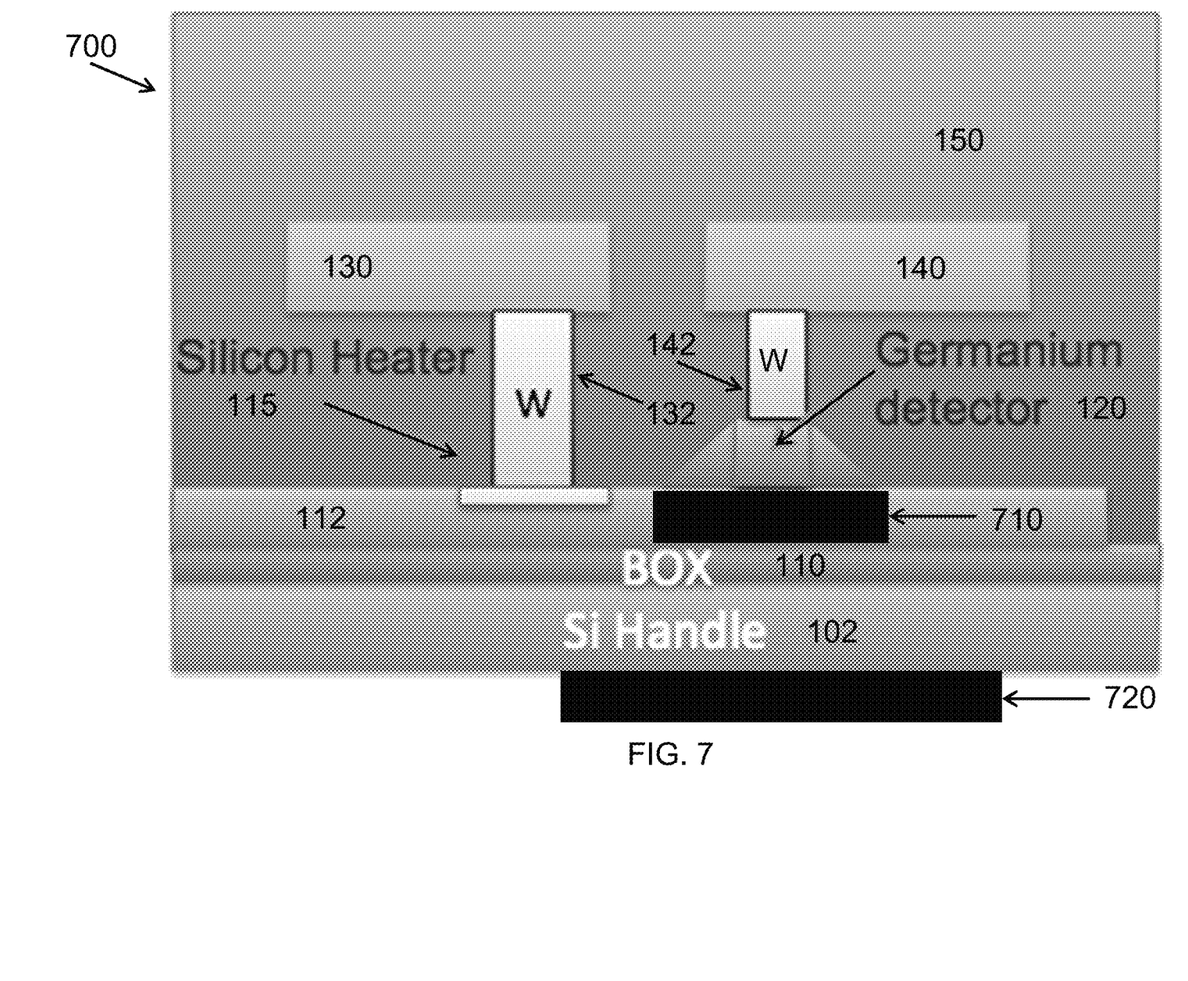
FIG. 7 is a schematic diagram in cross section of a silicon photonic wafer showing the relative orientation of a germanium photodetector, a silicon heater and a cooler.

FIG. 7 is a schematic diagram 700 in cross section of a silicon photonic wafer showing the relative orientation of a germanium photodetector 120, a silicon heater 115 and a cooler. In FIG. 7 there is shown a silicon wafer 102 that serves as a handle, a BOX layer 110, a silicon device layer 112, the silicon heater 115, the germanium photodetector 120, a tungsten (W) contact 132 to the silicon heater 115, a tungsten contact 142 to the germanium photodetector 120, and electrical terminals 130 and 140. The electrical terminals can be constructed from metallization layers that are provided as part of conventional CMOS processing. One can also have terminals in electrical communication with each of the silicon heater 115 and germanium photodetector 120 provided by way of silicon device layer 112. An oxide layer 150 may be deposited over the silicon heater 115 and germanium photodetector 120. In one embodiment, the cooler 710 is placed adjacent the germanium photodetector 120. In another embodiment, the cooler 720 is placed adjacent the handle 102, at a somewhat larger distance from the germanium photodetector 120. In some embodiments, the cooler (710 or 720) can be a thermoelectric cooler.

The doping of the heater can be tuned to increase/decrease the resistance of the heater depending on the amount of heating required and the available voltages. In some embodiments, the heater can be used both in front and behind the germanium photodetector. However, a high doping resistor will attenuate significant light if used on both sides of the germanium photodetector if the resistor is in the optical path.

In another embodiment, it is believed that the heater can be used to tune the band edge of an electro-absorption modulator comprising germanium. In such an embodiment, the heater would allow tuning of the band gap of the electro-absorption modulator. The electro-absorption modulator relies on operating at the band edge. A thermal deviation would cause the band edge to vary, and would be expected to degrade the modulation effect.

In another embodiment, the germanium is configured to work as a laser. Lasers are temperature sensitive and can be stabilized by either a heater or cooler.

In another embodiment, the detector is a p-i-n diode.

In a further embodiment, the detector is a photoconductive detector.

In yet another embodiment, the detector is an avalanche detector. Avalanche detectors are particularly sensitive to operating conditions. The gain and bandwidth at a given bias voltage will vary significantly as a function of temperature and time. Significant effort can be expended to build bias circuitry that can adequately stabilize the avalanche detector. Using a temperature control element may be used to give an additional degree of freedom to bias control, significantly reducing the demand on the voltage bias circuitry.

In one embodiment, the Ge body contains, at least partially, a compound containing at least two of silicon, germanium, carbon and tin.

In a further embodiment, the Ge body is grown on partially etched silicon. In a further embodiment, light is incident on the detector from multiple sides. In various embodiments, the germanium is grown using any convenient chemical vapor deposition technique, including, by way of example, ultra high vacuum CVD (UHV-CVD), metallo-organic CVD (MOCVD), plasma enhanced CVD (PEVCD), atmospheric pressure CVD APCVM low pressure CVD (LPCVD), rapid thermal; CVD (RTCVD) and reduced pressure CVD (RPCVD). In some embodiments, the silicon substrate is doped prior to device fabrication. In various embodiments, the doped regions comprise multiple implants and/or diffusions. In some embodiments, the Ge body has a buffer layer (e.g. SiGe, amorphous Ge, SiN) between the silicon device layer and the main Ge body.

In some embodiments, the doped regions vary in doping intensity, for example, being linearly doped. In some embodiments, the doping concentration varies as a function of depth in the silicon.

In some embodiments, the temperature control device is fabricated on the silicon device layer. In other embodiments, the temperature control device is fabricated using backend processing. In further embodiments, the temperature control device is located within the detector. In yet further embodiments, the temperature control device uses at least one the same electrical contacts as the signal.

The substrate may define a plane on which the detector sits. In some embodiments, the temperature control device may be located tangentially to the plane of the substrate. In other embodiments, the temperature control device may be located laterally in the plane of the substrate.

In some embodiments, a single temperature control element can be in conjunction with multiple photodetectors.

In some embodiments, a thermal measurement device is provided in proximity to the germanium device, whether a photodetector, an electro-absorption modulator, or some other electro-optical device. The thermal measurement device any be any convenient device. In some embodiments the thermal measurement device is a Proportional to Absolute Temperature (PTAT) device. Examples of prior art PTAT circuits are described in U.S. Pat. No. 8,274,021, and are believed to be suitable for use in the present invention.

Figure 8:
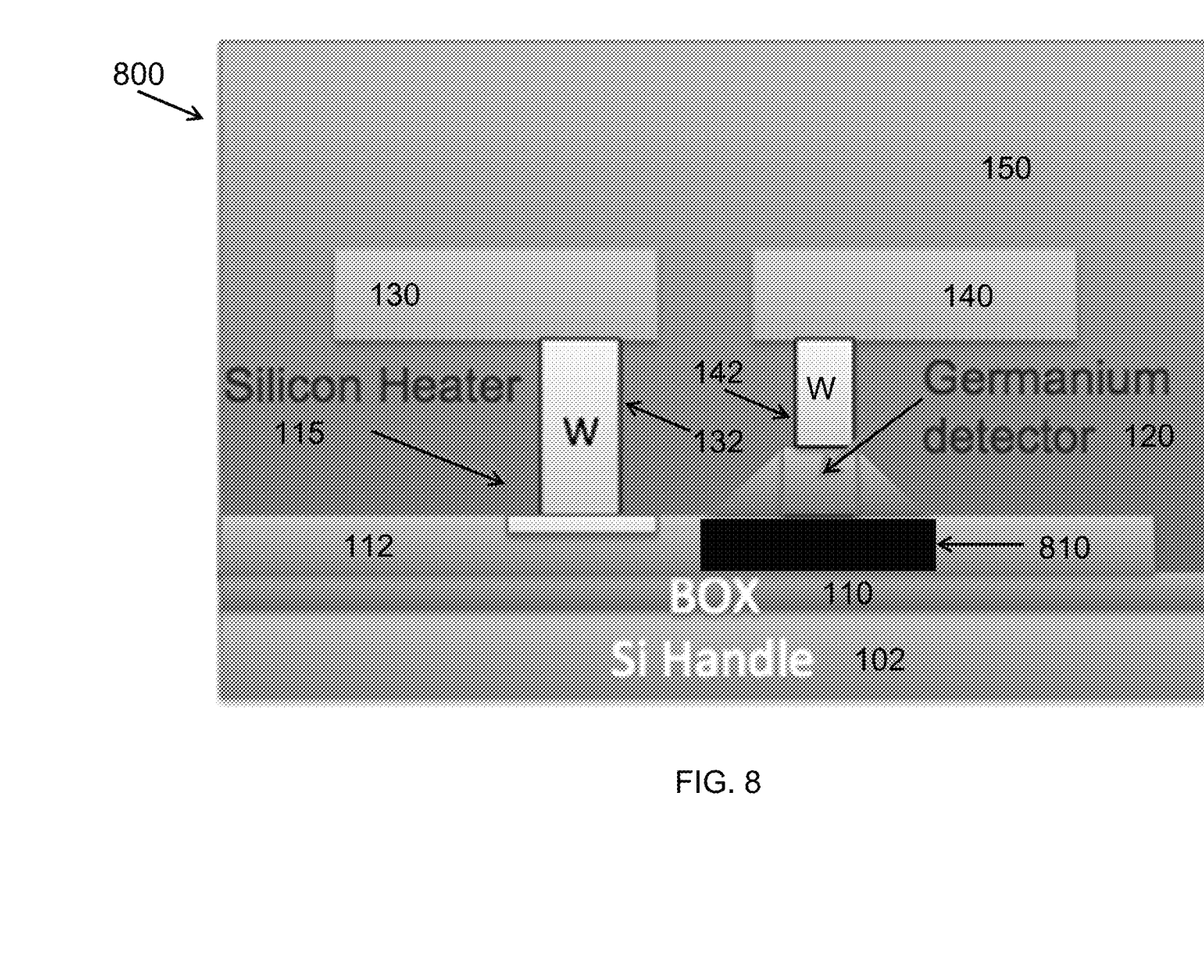
FIG. 8 is a schematic diagram in cross section of a silicon photonic wafer showing the relative orientation of a germanium photodetector, a silicon heater and a PTAT.

FIG. 8 is a schematic diagram 800 in cross section of a silicon photonic wafer showing the relative orientation of a germanium photodetector 120, a silicon heater 115 and a PTAT. In FIG. 8 there is shown a silicon wafer 102 that serves as a handle, a BOX layer 110, a silicon device layer 112, the silicon heater 115, the germanium photodetector 120, a tungsten (W) contact 132 to the silicon heater 115, a tungsten contact 142 to the germanium photodetector 120, and electrical terminals 130 and 140. The electrical terminals can be constructed from metallization layers that are provided as part of conventional CMOS processing. One can also have terminals in electrical communication with each of the silicon heater 115 and germanium photodetector 120 provided by way of silicon device layer 112. An oxide layer 150 may be deposited over the silicon heater 115 and germanium photodetector 120. In one embodiment, the PTAT 810 is placed adjacent the germanium photodetector 120.

In some embodiments, a feedback loop and/or a feed forward loop is provided to control the temperature of the germanium device, whether a photodetector, an electro-absorption modulator, or some other electro-optical device. Both feedback and feed-forward loops used to control or regulate temperature are well known in the art. Examples are described in U.S. Pat. No. 5,130,920.

Since efficient thermal control requires the temperature control element to be placed very close to the detector, the interference of the heater's signal with the photodetector signal is a distinct possibility. In order to avoid such an outcome, some embodiments of the detector may use an electrical barrier. This barrier may comprise an insulating material, an undoped semiconductor, or a doped semiconductor. One embodiment of a doped semiconductor barrier is a p-n-p-n junction. In another embodiment, the barrier is made of a deep substrate etch that mostly isolates the detector.

In some applications, it can be useful to control the temperature of the germanium photodetector 120 in a narrow temperature range, for example if one wants the responsivity to be substantially constant over time, and when the device is used in different thermal environments. For example, it may be necessary to use the device in a cold environment (such as out of doors on a cold winter day) and at other times in a warm environment (such as out of doors on a hot summer day). In some embodiments, the device can be operated in a temperature in the range of range of 0° C. to 90° C., e.g., 0° C., 5° C., 10° C., 15° C., 20° C., 25° C., 30° C., 35° C., 40° C., 45° C., 50° C., 55° C., 60° C., 65° C., 70° C., 75° C., 80° C., 85° C., and 90° C. If the device were to be operated at a selected discrete temperature in the range, such as 0° C., 5° C., 10° C., 15° C., 20° C., 25° C., 30° C., 35° C., 40° C., 45° C., 50° C., 55° C., 60° C., 65° C., 70° C., 75° C., 80° C., 85° C., or 90° C., the responsivity of the germanium photodetector 120 would be invariant, or close to invariant, independent of the ambient temperature. See Table I. In some embodiments, the operating temperature is maintained at a controlled temperature higher than either of the two ambient (hot and cold) conditions. Such temperature control would make possible more precise operation. Such control within a narrow range (e.g., above a defined minimum temperature and below a defined maximum temperature) can in some embodiments be performed using one or more heaters, and in some embodiments using one or more heaters and a cooler.

Design and Fabrication

Methods of designing and fabricating devices having elements similar to those described herein, including high index contrast silicon waveguides, are described in one or more of U.S. Pat. Nos. 7,200,308, 7,339,724, 7,424,192, 7,480,434, 7,643,714, 7,760,970, 7,894,696, 8,031,985, 8,067,724, 8,098,965, 8,203,115, 8,237,102, 8,258,476, 8,270,778, 8,280,211, 8,311,374, 8,340,486, 8,380,016, 8,390,922, 8,798,406, and 8,818,141, each of which documents is hereby incorporated by reference herein in its entirety.

Definitions

As used herein, the term "optical communication channel" is intended to denote a single optical channel, such as light that can carry information using a specific carrier wavelength in a wavelength division multiplexed (WDM) system.

As used herein, the term "optical carrier" is intended to denote a medium or a structure through which any number of optical signals including WDM signals can propagate, which by way of example can include gases such as air, a void such as a vacuum or extraterrestrial space, and structures such as optical fibers and optical waveguides.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

INCORPORATION BY REFERENCE

Any patent, patent application, patent application publication, journal article, book, published paper, or other publicly available material identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A temperature-controlled photodetector, comprising:
   a wafer comprising a semiconductor layer;
   a photodetector located on the semiconductor layer, wherein said photodetector has at least one first edge; and
   a temperature control element formed at least in part in the semiconductor layer, wherein said temperature control element has a second edge situated proximate said at least one first edge of said photodetector, and wherein said temperature control element comprises at least one of a heater and a cooler.

2. The temperature-controlled photodetector of claim 1, wherein said photodetector is a germanium photodetector.

3. The temperature-controlled photodetector of claim 1, wherein said photodetector is disposed within the wafer.

4. The temperature-controlled photodetector of claim 1, wherein said second edge of said temperature control element is situated within a distance of less than 10 microns from said at least one first edge of said photodetector.

5. The temperature-controlled photodetector of claim 1, wherein said photodetector is disposed directly upon the semiconductor layer.

6. The temperature-controlled photodetector of claim 1, wherein said temperature control element is a Peltier device.

7. The temperature-controlled photodetector of claim 1, further comprising a thermal measurement device formed within the semiconductor layer proximate to said photodetector.

8. The temperature-controlled photodetector sub-system of claim 2 wherein the semiconductor layer comprises a silicon layer and wherein the germanium photodetector is disposed directly upon the silicon layer.

9. The temperature-controlled photodetector of claim 8, wherein said silicon layer is configured to provide an electrical contact to the germanium photodetector.

10. The temperature-controlled photodetector of claim 1, wherein said temperature control element comprises two heaters or two coolers.

11. The temperature-controlled photodetector of claim 10, wherein the two heaters or the two coolers are situated on opposite sides of said photodetector.

12. The temperature-controlled photodetector of claim 1, wherein the temperature control element comprises a resistive heater.

13. The temperature-controlled photodetector sub-system of claim 1, further comprising a signal barrier formed in the semiconductor layer between said photodetector and said temperature control element so as to electrically insulate the photodetector from the temperature control element.

14. The temperature-controlled photodetector of claim 13, wherein said signal barrier is a p-n-p-n junction.

15. A method of making a temperature-controlled photodetector, comprising the steps of:
    fabricating a photodetector located on a semiconductor layer of a wafer, wherein said photodetector has at least one first edge; and
    fabricating a temperature control element at least in part in the semiconductor layer, said temperature control element having a second edge situated proximate to said first edge of said photodetector, wherein said temperature control element comprises at least one of a heater and a cooler.

16. The method of making a temperature-controlled photodetector of claim 15 comprising forming, upon a substrate, a silicon layer as the semiconductor layer, wherein fabricating the photodetector comprises depositing germanium upon the silicon layer to form a germanium photodetector.

17. The method of making a temperature-controlled photodetector of claim 15, wherein fabricating said temperature control element comprises forming a resistive heater in the semiconductor layer.

18. The method of making a temperature-controlled photodetector of claim 15, comprising forming said second edge of said temperature control element less than 10 microns from said at least one first edge of said photodetector.

* * * * *